United States Patent [19]
Lowenstein et al.

[11] Patent Number: 5,170,114
[45] Date of Patent: Dec. 8, 1992

[54] HARMONIMETER INPUT CIRCUIT AND METHODS OF CONSTRUCTING AND UTILIZING SAME

[75] Inventors: Michael Z. Lowenstein, Mequon, Wis.; Ronald G. Jawernycky, Farmington Hills, Mich.

[73] Assignee: Myron Zucker, Inc., Royal Oak, Mich.

[21] Appl. No.: 757,624

[22] Filed: Sep. 11, 1991

[51] Int. Cl.⁵ ............................................ G01R 29/26
[52] U.S. Cl. .................................. 324/128; 324/520; 324/623; 324/626; 379/21
[58] Field of Search ............... 324/128, 254, 244, 225, 324/623, 620, 626, 520; 379/21

[56] References Cited

U.S. PATENT DOCUMENTS

| | | | |
|---|---|---|---|
| 3,978,401 | 8/1976 | Lum | 324/620 |
| 4,417,310 | 11/1983 | Sugihara | 324/623 |
| 4,818,947 | 4/1989 | Zucker | 324/520 |
| 4,902,960 | 2/1990 | Lowenstein | 324/613 |
| 4,977,374 | 12/1990 | Kleiner | 324/254 |

Primary Examiner—Kenneth A. Wieder
Assistant Examiner—Jose M. Solis
Attorney, Agent, or Firm—Irving M. Weiner; Joseph P. Carrier; Robert M. Petrik

[57] ABSTRACT

A portable instrument for locating and measuring harmonic distortion in a conductor. The instrument permits voltage and current harmonics to be easily read while the load is changing. Thus, the instrument may provide a great deal of insight as to the source of problem causing harmonics.

19 Claims, 4 Drawing Sheets

HARMONIMETER INPUT CIRCUIT AND METHODS OF CONSTRUCTING AND UTILIZING SAME

BACKGROUND OF THE INVENTION

1. Field of the Invention

The present invention pertains to apparatus for measuring and indicating harmonic distortions in conductors, such as power lines. More particularly, the present invention pertains to a portable, simple-to-use, and highly versatile instrument for quickly measuring and indicating a range of individual harmonic distortions in conductors.

2. Description of the Relevant Art

There are known devices for detecting and/or displaying harmonic distortion in conductors. Such known devices are, for example, disclosed in U.S. Pat. Nos. 2,782,366, 3,916,296 and 3,927,281.

U.S. Pat. No. 2,782,366 discloses "oscillographic apparatus for analyzing the performance of Amplifiers, Modulators, Detectors and the like." The disclosed apparatus comprises a circuit including a test oscillator, a group of potentiometers, amplifiers tuned to first, second and any other desired harmonic, a battery, and a group of oscilloscopes for providing output displays. This known apparatus has many disadvantages. For example, it is very bulky and difficult to use, especially in remote locations. Also, this apparatus can only be used in testing individual parts which have been disconnected/isolated from their normal use, and harmonic distortion in voltage signals.

U.S. Pat. No. 3,916,296 discloses a high sensitivity/high resolution distortion analyzer including a parallel-T circuit bridge that is tuned by adjusting two variable elements, typically a resistor in one branch of the circuit and a capacitor in a second branch of the circuit. The tuning is achieved by separate feed-back circuits that utilize a $+45°$ or a $-45°$ phase-shifted signal derived from an input voltage signal. This apparatus is substantially easier to use than that disclosed in U.S. Pat. No. 2,782,366, but still has several problems and disadvantages associated therewith. For example, the apparatus is still quite inconvenient to use (especially in remote locations) because the operator is required to turn off the power to an electrical component before connecting the analyzer thereto (resulting in expensive down time), and because the operator is required to adjust the variable elements. Also, the disclosed analyzer, like that disclosed in U.S. Pat. No. 2,782,366, is limited to analyzing the harmonic distortions of a voltage signal, and does not include any means for selectively choosing various signal harmonics to be measured.

U.S. Pat. No. 3,927,281 discloses an instrument for measuring harmonic distortion in telephone transmission lines. The instrument measures the harmonic distortion introduced during telephone line transmission, and can distinguish between the harmonic distortion introduced at the send terminal and that introduced in the receiver terminal. The disclosed instrument comprises a frequency phase lock circuit which generates "disturbance-free, in-phase and quadrature voltage signals of a received test tone, the disturbance-free generated tones being different from the transmitted test tone as a result of possible frequency shift along the transmission channel and phase shifts in the terminal equipment at both ends". As disclosed, the instrument is connected to an oscilloscope for providing an output display. This instrument has associated therewith substantially the same problems and disadvantages as discussed above with regard to the analyzer disclosed in U.S. Pat. No. 3,916,296.

Conventional distortion analyzers, including those discussed above, have many problems and disadvantages associated therewith, and have as a whole failed to fulfill a need in the art for a portable, simple-to-use and highly versatile instrument which can be used for quickly and easily locating and measuring problem-causing harmonic distortion in substantially any conductor while the conductor is in normal operation.

Additionally, the present inventors have previously proposed, in U.S. Pat. No. 4,818,947 (the '947 patent hereinafter) and 4,902,960 (the '960 patent hereinafter), apparatus for measuring harmonic distortion in a conductor. The '947 patent discloses a portable instrument for locating and measuring harmonics in a conductor based on a current input signal from an easily manipulatable current transformer which has been secured about the conductor. The apparatus includes a selector switch for permitting an operator to manually select which harmonic of the input signal is to be measured, and an auto-gain circuit for permitting harmonics to be read while a load drawn through the conductor is changing. The '960 patent discloses an optional improvement to the apparatus of the '947 patent, whereby the apparatus can receive a voltage input signal rather than a current input signal, and will measure voltage harmonics thereof. The option consists of a voltage input circuit which can selectively be coupled between a conductor and the apparatus of the '947 patent for providing an appropriate voltage input signal thereto, and a selector switch incorporated into the apparatus of the '947 patent which permits the operator to manually adjust the apparatus for either a current input signal or a voltage input signal.

Although the apparatus of the '947 and '960 patents is very advantageous over the previously known apparatus for detecting and/or displaying harmonic distortion in conductors, the apparatus of the '947 and '960 patents remains to be improved relative to convenience in use, accuracy of measurements, extent/amount of information output, etc.

SUMMARY OF THE INVENTION

The present invention has been designed to improve the apparatus of the '947 and '960 patents.

According to the present invention, there is provided an apparatus for locating and measuring harmonic distortion in a conductor, the apparatus comprising an input means detachably connectable to a conductor for providing an input signal indicative of electrical energy in the conductor, filter means connected to the input means for filtering the input signal relative to a predetermined frequency, modifying means connected to the input means and receiving the input signal therefrom, the modifying means providing a modified signal indicative of the strength of a single, predetermined harmonic of the input signal, and harmonic varying means connected to the modifying means for selectively varying the single, predetermined harmonic which is indicated by the modified signal; and said modified signal indicates one of voltage harmonics and current harmonics.

Additionally, the apparatus according to the present invention may further comprise means for selectively monitoring a level of energy in the conductor, display means connected to the harmonic varying means and receiving the modified signal therefrom, the display means providing the display of the modified signal, and means interconnected between the first and second means for automatically controlling a gain of the input signal so that the input signal remains essentially constant despite variations of the electrical energy in the conductor.

It is an object of the present invention to provide a portable, simple-to-use and highly versatile instrument for measuring a range of individual harmonic distortions in electrical conductors, and for readily locating sources of such harmonic distortions.

Another object of the present invention is the provision of such an instrument which can be readily attached to conductors, such as power lines, while electrical energy is continuously present therein, or in other words, without circuit interruptions.

A further object of the present invention is the provision of such an instrument capable of producing very accurate harmonic measurements and indications over very large voltage and current ranges, and which includes a filter arrangement to assure a highly accurate output display signal.

Still another object of the present invention is the provision of a fast acting auto-gain circuit acting on an input signal from the first means to thereby eliminate the need for manually zeroing the instrument as circuit loads vary, and so that harmonics can be easily and accurately read while the amount of electrical energy in the conductor is changing.

Still a further object of the invention is to provide such an instrument which permits an operator to simultaneously, easily monitor the level of current and a range of harmonic distortions in an electrical conductor.

Yet another object of the present invention is the provision of such an instrument which is very compactly and efficiently arranged in an impact-resistant, water-resistant case such that an operator can easily carry and manipulate the instrument with a single hand.

Other objects, advantages and salient features of the present invention will become apparent from the following detailed description, which, when taken into conjunction with the annexed drawings, discloses a preferred embodiment of the present invention.

DETAILED DESCRIPTION OF THE PREFERRED EMBODIMENT

Figures 1, 2, 3, 5A, 5B:
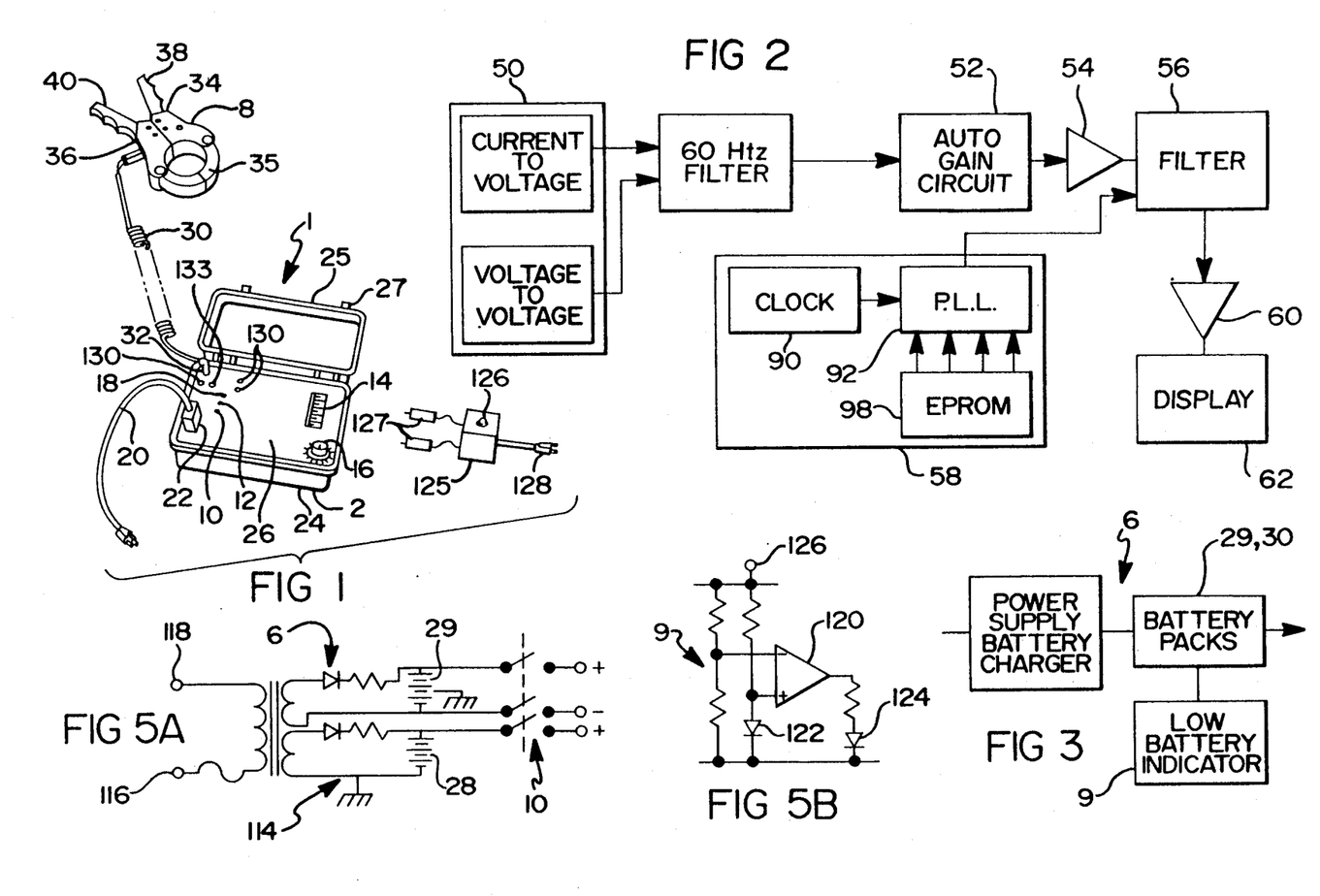
FIG. 1 is a perspective view of a portable instrument according to the present invention.
FIG. 2 is a block diagram of a main circuit of the instrument shown in FIG. 1.
FIG. 3 is a block diagram of an internal, rechargeable power supply of the instrument shown in FIG. 1.
FIG. 5a is a schematic diagram of the power supply circuit.
FIG. 5b is a schematic diagram of a low battery indicator circuit for the power supply.

Referring to FIG. 1, there is shown a portable instrument according to the preferred embodiment of the invention, which is generally indicated by reference numeral 1. The instrument includes a carrying case 2 which internally houses the main circuit 4 shown in FIGS. 4a–4c, the power supply circuit 6 shown in FIG. 5a, and the low battery indicator circuit 9 shown in FIG. 5b; a clamp on current transformer 8 which is selectively connectable to the main circuit 4 through a current input jack 32; a power on/off switch 10 and a corresponding power on indicator light 12; a display scale 14 for indicating the level of harmonic distortion; a selector switch 16 which permits an operator to select a particular harmonic which is to be shown on the display scale 14; a low battery indicator light 18; a battery charging cord 20 and a corresponding power input jack 22. Additionally, input jacks 130 may be included for measuring the voltage harmonics.

The case 2 is preferably constructed from a moldable, impact-resistant, water-resistant plastic, and has the circuits 4, 6, 9 permanently mounted in a base portion 24 thereof below a face plate 26. The power supply circuit 6 preferably includes the pair of rechargeable battery packs 28, 29 (FIG. 5a), which battery packs would be recharged when necessary using the removable charging cord 20. However, circuit 6 could have any other appropriate/desired construction. For example, the circuit 6 could include a single battery pack and a voltage inverter.

The current transformer 8 is selectively connectable to the main circuit 4 through a signal cord 30 which plugs into the current input jack 32 on the face plate 26. The depicted, preferred current transformer 8 is a conventional, readily available component constructed as two halves 34, 36, each including a portion of the transformer core 35 at one end thereof. The halves 34, 36 are pivotally connected together such that the portions of the transformer core 35 can be opened by manually squeezing together a pair of handles 38, 40 at opposite ends of the halves 34, 36 thereof. The current transformer 8 also includes a biasing means (not shown) for normally holding the core end of the transformer in a closed position. The current transformer 8 can be easily attached to/around substantially any conductor by simply squeezing the handles 38, 40 together, positioning the opened end of the circuit transformer next to the conductor, and releasing the handles so that the opened end of the transformer clamps around the conductor. Thus, the current transformer can be clamped around the conductor without interrupting the circuit, thereby enabling measurements during normal operations of equipment.

The current transformer 8 preferably has a frequency response to at least 5 kilohertz so that higher harmonics are not attenuated and so that the transformer provides an accurate input signal over a large measurement range. Also, the transformer is preferably insulated to permit measurements in bus bar systems energized up to very high voltages, such as up to 600 volts AC.

The harmonic selector switch 16 permits an operator to choose the particular harmonic which is to be measured by the instrument. The selector switch is preferably constructed as a rotatable dial which locks into a plurality of positions corresponding to the various harmonics. For example, in a preferred construction of the invention, the selector switch 16 could be rotated to eleven different positions corresponding to current or voltage amplitude for the fundamental, 2nd harmonic, and odd harmonic 3rd through 19th. These harmonics are the most likely to cause problems in electrical power systems.

The display scale 14 provides output readings for the instrument, which readings show the amplitude of the selector harmonic as a percentage of the fundamental amplitude. As shown, the display scale 14 is preferably constructed as a multi-step light bar and a corresponding printed scale reading 0% to 100% for current harmonics or 0% or 10% for voltage harmonics.

Optionally, the instrument 1 may also include a recording device (not shown) as is well known in the art, such as a paper chart and a marking tool, which could record the output readings over a period of time.

When the instrument 1 is not being used, or is being transported, the signal cord 30, the charging cord 20, or the plugs 128 with voltage input box 125 and test probes 127, are disconnected from their associated jacks 22, 32, 130 and a lid 25 of the case 2, is secured over the base 24 by latches 27. Also, a padded carrying case (not shown) may be used for conveniently carrying the case 2, the current transformer 8, the voltage input box 125, the signal cord 30 and the charging cord 20 during transportation or periods of non-use.

Figures 4, 4A:
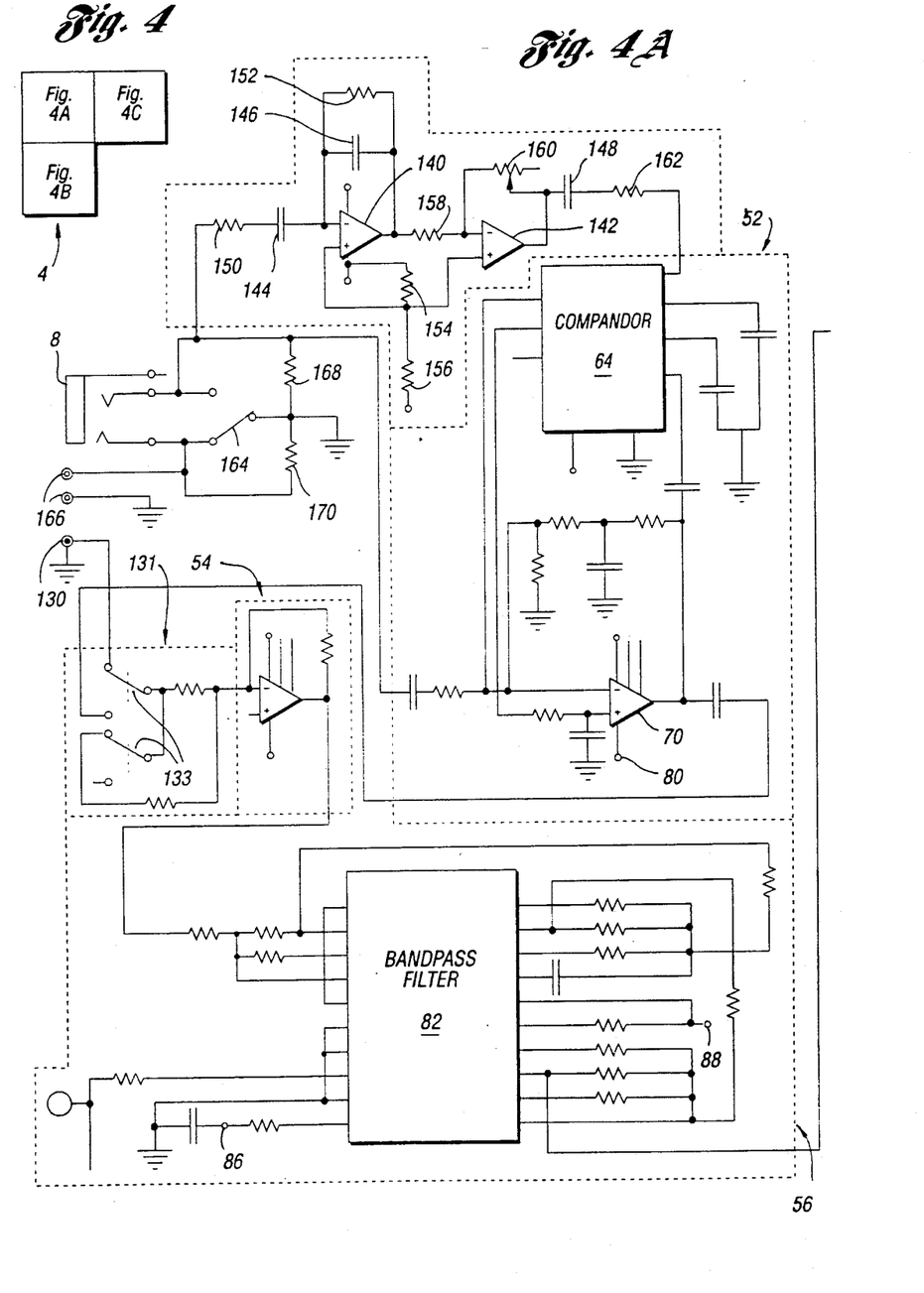
FIGS. 4a–4c are collectively a schematic diagram of the main circuit for the instrument, as shown in FIG. 4.

Referring to FIGS. 2 and 4 there is respectively shown a block diagram and a schematic diagram of the main circuit 4 of the instrument 1. The main circuit 4 comprises an input signal conditioner 50 which receives an input signal from the current transformer 8, input filter circuit 51 which filters the conditioned current input signal relative to a predetermined frequency, such as 60 Hertz, to get rid of noise in the signal and significantly improve the accuracy of the harmonic amplitude display 14, auto-gain circuit 52 which receives the filtered, conditioned input signal, a voltage/current input circuit 131, a buffer 54, a filter 56 which filters the input signal and provides a modified signal indicative of the strength of a single predetermined harmonic of the input signal (corresponding to the harmonic chosen using the selector switch 16) relative to the strength of the fundamental frequency component of the input signal, a programmable clock or frequency synthesizer 58 which includes the harmonic selector switch 16 and is connected to the filter 56 for permitting the operator to selectively vary the single, predetermined harmonic which is indicated by the modified signal, an amplifier 60, and a display circuit 62.

According to one embodiment of the present invention the instrument 1 is used to measure a current input signal from the current transformer 8. However, it is within the scope of the present invention that the instrument 1 could alternately be used to measure the harmonic distortions of a voltage input signal by connecting the main circuit 4 between the conductor and ground.

Figure 4B:
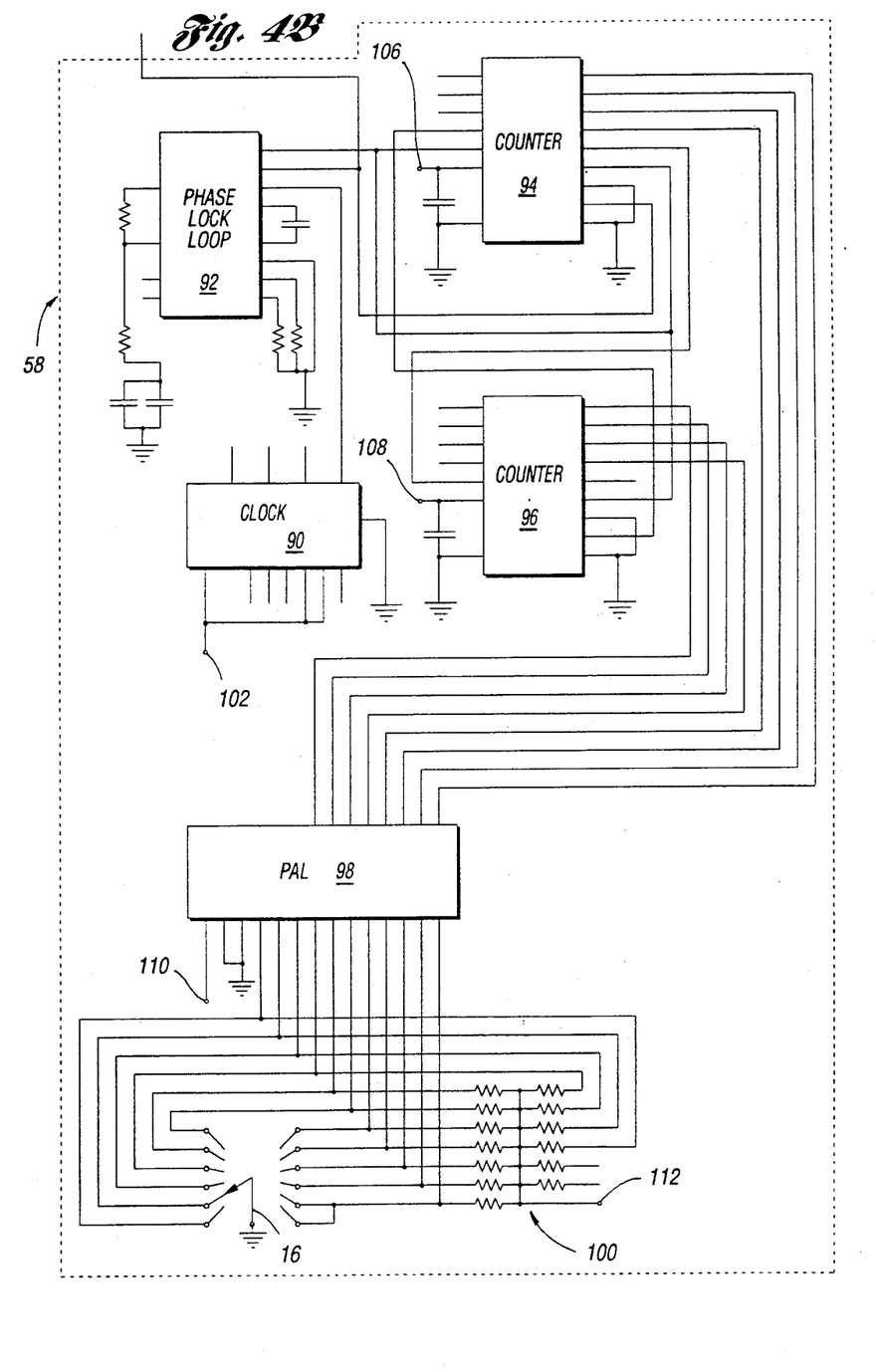
Figures 4C, 6:
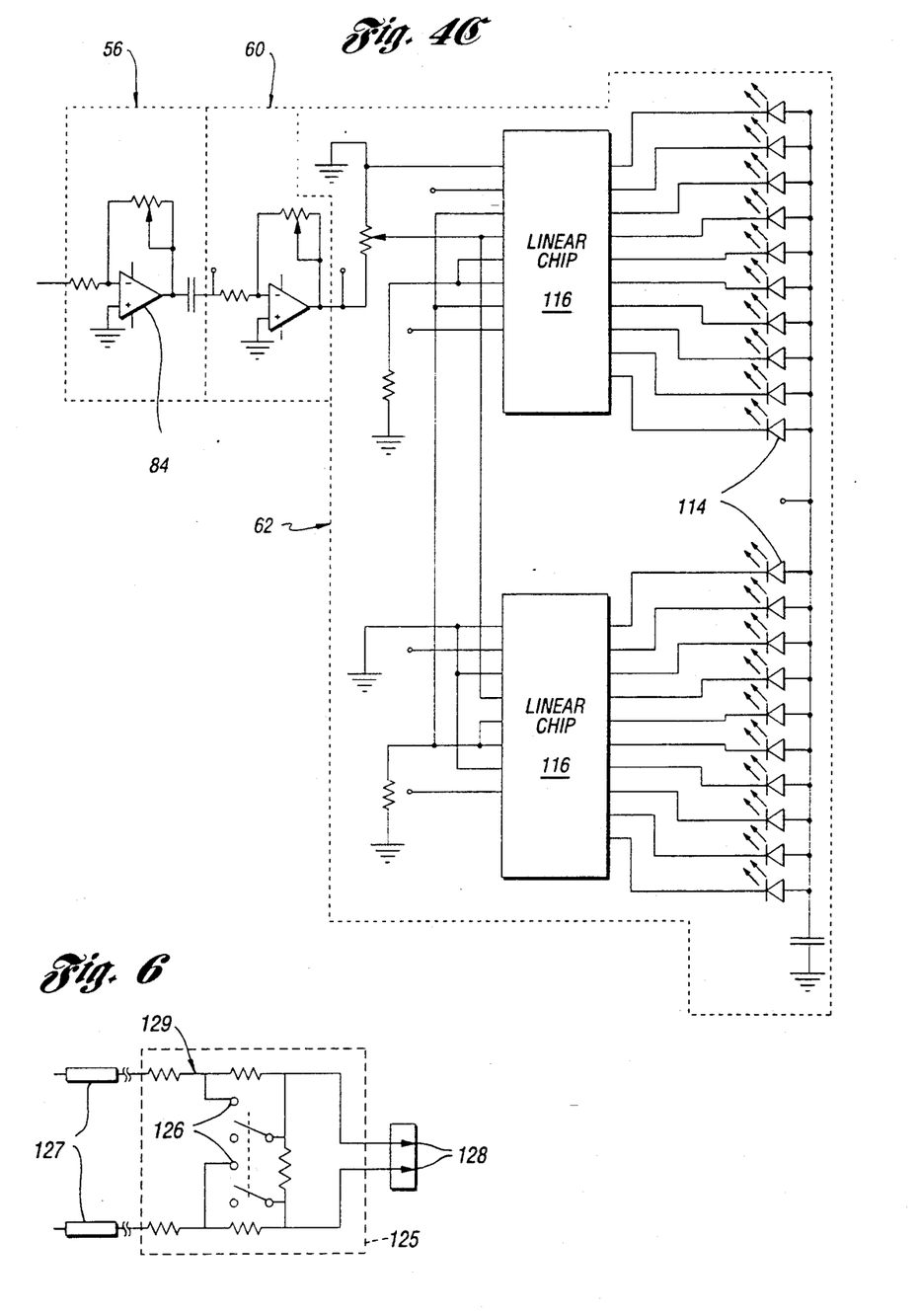
FIG. 6 is a schematic diagram of the voltage input box.

To measure the harmonic distortions of a voltage input, a voltage input box 125, (FIG. 6), containing a voltage divider network 129 to provide the proper operating voltage for the main circuit 4 of the harmonimeter is provided. The line voltage (600/480 or 240) is reduced to approximately 33 mv which is the correct operating voltage for the op-amp input of buffer 54. As shown in FIG. 6, the input box 125 includes test probes 127 and output plug 128. Output plug 128 connects to the harmonimeter main circuit 4 at connection 130 shown in FIG. 4a. The switch 126 in FIG. 6 is a DPDT (Double Pole/Double Throw) switch and is shown in the 240 volt position. The alternate position for switch 126 is for 600/480 volts.

As shown in FIG. 4a, connection 130 receives plug 128. The voltage/current input circuit 131 connects the proper input to the amplifier input and changes the gain of the amplifier. Voltage/current input circuit 131 comprises a second DPDT switch 133. Switch 133 directs the input to the proper part of the input signal conditioner (50) and enables the harmonic scale to read 0% to 10% voltage harmonics instead of 0% to 100% of current harmonics, and visa versa. The switch 133 is shown in the "voltage harmonic" position. The alternate position would measure "current harmonics".

The depicted input filter circuit 51 is an active filter comprising a pair of op amps 140, 142, capacitors 144, 146, 148, and resistors 150, 152, 154, 156, 158, 160 and 162. As discussed above, such filter circuit is adapted to filter the conditioned current input signal relative to a predetermined frequency, such as 50 or 60 Hertz, to significantly improve the accuracy of the output display 14. Specifically, the input filter circuit permits the output display 14 to indicate a harmonics level relative to a true percentage of fundamental rather than relative to a total percentage of the current input signal.

The input signal conditioner 50 shown in FIG. 2 is indicated as having both a "current to voltage" portion and a "voltage to voltage" portion corresponding to a current input signal and a voltage input signal, respectively.

According to another aspect of the invention, and as shown in FIGS. 1 and 4a, a switch 164 and a jack 166 are provided on the face plate 26 of the device 1 which permit an operator to also monitor the level of current in the conductor, while the apparatus is being (primarily) used to monitor current harmonics. The switch 164 is preferably a single pole, single throw switch of a push button type which would be moved to an "on" position thereof when it is desired to monitor the level of current in the conductor, and a conventional, digital voltmeter would be connected to the jack 166. As shown in FIG. 4a, a voltage divider consisting of resistors 168, 170 is preferably associated with the switch 164 for providing a reduced strength signal from the output jack 166.

The auto-gain circuit 52 is constructed of fast-acting, state of the art electronic components which are initially factory calibrated, thereby eliminating any need for manually zeroing the meter before each use, or as the amount of electrical energy in the conductor varies. This feature of the present invention desirably permits harmonics to be easily read while the load is changing. Thus, data can be taken to show the dependence of a single harmonic or several harmonics upon changing load conditions, and such data can provide a great deal of insight as to the source of problem-causing harmonics.

The preferred embodiment of the auto-gain circuit 52 comprises a compandor chip 64, such as an NE 572, and an operational amplifier (op-amp) 70. The compandor chip 64 performs the functions of a voltage to current converter (or rectifier), a buffer and a current control variable gain amplifier, and the chip could be replaced with three components which perform the separate functions. Also, a different compandor chip, such as NE 571, could be used in the present invention to replace both the chip 64 and op-amp 70. The automatic gain circuit 52 receives an input signal from the input filter circuit 51 and controls the gain of the input signal to provide a substantially constant output signal to the buffer 54. Chip 64 and op-amp 70 receive power input from the battery 28 at terminals 72, 74, respectively, while op-amp 70 is also connected to battery 29 at terminal 76. Buffer 54 is connected to battery 29 at terminals 78, 80.

As depicted, the input filter circuit 51 and the auto-gain circuit 52 preferably function only in relation to current input signals from the current transformer 8, whereas voltage input signals from the voltage input box 125 pass directly to the buffer section 54.

Filter 56 preferably comprises a multiple-order programmable, switched capacitor filter 82 (shown in FIG. 4a), such as LTC 1061 CN, and an amplifier 84 (shown in FIG. 4c). The filter 82 would preferably be programmed as a band pass filter using known software, and would be connected to battery 29 at terminals 86, 88. However, the filter 56 could comprise any desired or appropriate means. For example, the filter 56 could be constructed as an active filter using op-amps.

The frequency synthesizer or programmable clock 58 could, for example, comprise a source clock 90, a phase lock loop 92, a pair of "divide by n CMOS" counters 94, 96, a programmable logic array (PAL) 98, the harmonic selector switch 16, and a pull-up resistor network 100 associated with the switch 16. The source clock 90 is preferably a one kilohertz source clock, such as a PXO-1000, programmed as a one kilohertz source clock, while a 4046 chip could be used as the phase lock loop 92, 4522 chips could be used as counter dividers 94, 96, and an EPROM chip, such as TMS 2516, could be used as the programmable logic array 98. Of course, any other desired source clock 90 could be used, in which case a different, appropriate programmable logic array 98 might also have to be substituted for the TMS 2516. Components 90, 94, 96, 98 and 100 are each connected to the battery 29 at terminals 102, 106, 108, 110, and 112, respectively. The filter 56 is connected to the frequency synthesizer 58 through the output of the phase lock loop 92.

As shown, the preferred display circuit 62 could, for example, include a plurality of LED's 114 corresponding to the number of steps in the display scale 14 and at least one linear programmable chip 116, such as LM 3914, which has been appropriately programmed in a known manner. However, it will be understood that the display circuit 62 and the display scale 14 could be alternatively constructed as any other desired display means, such as an analog type dial meter. Also, the display scale 14 could include multiple light bars corresponding to the number of harmonics measured, and the main circuit 4 (including the display circuit 62) could be modified to provide a simultaneous display of each of the measured harmonics as a percentage of the fundamental.

Referring to FIGS. 5a and 5b there is shown a power supply circuit 6 and a low battery indicator circuit 9 according to the present invention. The power supply circuit 6 preferably includes the pair of rechargeable battery packs 28, 29, as discussed above, as well as a recharger circuit 115 for the battery packs. The battery packs 28, 29 preferably have different voltage outputs. For example, battery pack 28 could have a +12 volt DC output, while battery pack 29 could have a +5 volt and a −5 volt DC output. The battery recharger circuit 115 has input terminals 116, 118 which would be connectable to an appropriate power source, such as 120 volts AC, through the recharger cord 20 when necessary.

The low battery indicator circuit 8 includes an amplifier 120 and a pair of LED's 122, 124, LED 122 functions as a voltage reference, while LED 124 lights to indicate low battery at indicator 18. As indicated, the low battery indicator circuit 8 is preferably connected to battery pack 28 at terminal 123.

As discussed above, the main circuit 4 of the harmonic distortion measuring instrument 1 permits the instrument to be used for measurements on systems having a wide range of voltages (for example, up to 600 volts), and will provide accurate harmonic readings over a very wide range of line currents (for example, over a range of 10-1000 amps). The depicted main circuit 4 could also be used to measure line currents in the range of 0-10 amps, but such measurements would not be as useful as measurements in the range of 10-1000 amps. It will be understood, however, that the depicted main circuit 4 is merely a preferred embodiment, and that the circuit 4 could be modified for accurate use in any voltage range and any current range.

Operation of the instrument 1 is as follows.

Initially, an operator would connect the current transformer 8 to the main circuit 4 by plugging it in to the input jack 32, and would then clamp the current transformer 8 around a desired conductor, such as a power line. The current transformer must be connected to the input jack 32 before it is clamped around the conductor, or a high voltage will be developed on the transformer leads and this can present a severe shock hazard.

Alternatively, the voltage input box 125 may be plugged into jack 130 and the test probes attached to the desired conductor.

For making the actual measurements, all that an operator is required to do is turn on the instrument 1 using the on/off switch 10, and then turn the harmonic selector switch 16 to the desired harmonic. Or for voltage harmonic measurement, switch 126 and switch 133 must be properly set. Normally, the selector switch will initially be turned to the fundamental harmonic, whereby the display scale 14 should read 100% if there is sufficient current in the conductor being measured. The operator then would turn the selector switch to each other desired harmonic and could record the harmonic amplitude measurements indicated by the display scale 14. Subsequently, the operator would interpret the recorded data to determine the sources of problems that have been encountered with particular conductors. Also, if it is desired to monitor the level of current in the actuator, the switch 164 would be moved to the on position thereof and an amperage meter would be connected to jack 166.

An exemplary data record sheet, including exemplary data, is shown in Table 1.

In reference to Table 1, the auto-gain feature of the instrument 1 was used to determine/record the amplitude of harmonic distortion in the conductor while a suspect harmonic source, such as an SCR drive, was turned on and off. In this manner, the auto-gain feature is particularly useful in locating equipment that is causing (or is the source of) harmonic distortion. From the data in Table 1, the operator would be able to trace motor overheating and excessive bearing wear to the fifth harmonic component in the motor current when the SCR drive is operated at high power. The harmonic current causes the motor rotor to "cog" and has the effect of hammering on the bearings. The extra current also increases the operating temperature of the motor.

Also, the operator would note the concentration of harmonic current in the capacitor. Since capacitor impedance decreases with frequency, the presence of harmonics causes a large increase in capacitor current, resulting in heat dissipation. When the SCR drive is at idle, the decrease is manageable, but with the SCR drive operating at high power, the capacitor current is near the limit for both the capacitor and the fuse. This could explain a capacitor fuse blowing which was observed. With the SCR drive at high power, enough harmonic distortion exists in the line to affect computer circuits.

On the basis of the data shown in Table 1, the operator will be able to recommend a desired course of action. In this case, a course of action would be recommended which would improve the overall power factor and reduce the harmonic interference. For example, a tuned fifth harmonic filter or trap, sized to improve the power factor to the desired value, could be connected to the line at the SCR drive. This should reduce the harmonic currents at the small capacitors. If the problems with high capacitor currents continue, as determined by a recheck with the instrument 1, replacing these capacitors with a trap is another possibility.

Harmonic distortion measurements obtained using the instrument 1 could obviously be used for many other purposes. For example, detection of the second harmonic of electrical energy in a conductor can be used to indicate DC current components. Also, the harmonic levels in each leg of a three-phase system could be measured separately to determine if the phases are equally loaded.

Although there has been described what is at present considered to be the preferred embodiment of the present invention, it will be understood that the invention can be embodied in other specific forms without departing from the spirit or essential characteristics thereof. For example, the modified signal which is being provided to display circuit 62 could also (or alternatively) be provided to a computerized energy management system which would automatically control the power in the conductor to be within a desired range. Similarly, the modified signal could also be provided to an appropriate alarm means, such as an audio alarm, a visual alarm, etc., which would be activated (for example) whenever a measured harmonic exceeded a predetermined maximum percentage of the fundamental.

The described embodiment is, therefore, to be considered in all aspects as illustrative, and not restrictive. The scope of the invention is indicated by the appended claims rather than the foregoing description.

TABLE 1

| | | | | | | | | | |
|---|---|---|---|---|---|---|---|---|---|
| PLANT | X Y Z Inc. | | DATE | today | PAGE | 1 | OF | 1 | |
| LOCATION | Big City, USA | | | | | | | | |

GENERAL DESCRIPTION of plant, problem, etc. Since installation of SCR adjustable speed drives on blower motors, computers have been malfunctioning. Capacitor fuses are blowing and other motors throughout the plant are overheating. Motor bearings are showing abnormal wear.

SYSTEM NAMEPLATE VOLTAGE volts   480   RATED LOAD kva   1500
POWER FACTOR from utility bill   75%   LOAD CURRENT amp   NA
POWER FACTOR measured   ___   MEASURING INSTRUMENT   ___
MEASURING POINT (diagram or description)
30 hp pump motor with 7.5 KVAR power factor correction capacitor.
A 100 KVA adjustable speed drive has been added to the line and its effect is to be measured.
OVER

| | | | | | | | | | |
|---|---|---|---|---|---|---|---|---|---|
| TEST NUMBER → | 1a | 1b | 1c | 2a | 2b | 2c | — | — | — |
| MEASURING POINT → | A | B | C | A | B | C | — | — | — |
| | STATUS + = ON, − = OFF | | | | | | | | |
| EQUIPMENT | | | | | | | | | |
| other equipment | + | + | + | + | + | + | — | — | — |
| 30 hp pump motor | + | + | + | + | + | + | — | — | — |
| variable drive | + | + | + | − | − | − | — | — | — |
| POWER LEVEL → | 70% | 70% | 70% | 0 | 0 | 0 | — | — | — |
| CURRENT amps → | 26 | 24 | 32 | 22 | 23 | 9 | — | — | — |
| VOLTAGE volts → | 465 | 465 | 465 | 470 | 470 | 470 | — | — | — |
| HARMONIC | | | | | | | | | |
| HARMONIC % 2 → | 0 | 0 | 0 | 0 | 0 | 0 | — | — | — |
| 3 → | 5 | 0 | 10 | 0 | 0 | 0 | — | — | — |
| 5 → | 30 | 20 | 85 | 10 | 0 | 25 | — | — | — |
| 7 → | 5 | 0 | 20 | 5 | 0 | 10 | — | — | — |
| 9 → | 5 | 0 | 10 | 0 | 0 | 0 | — | — | — |
| 11 → | 10 | 5 | 25 | 0 | 0 | 0 | — | — | — |
| 13 → | 0 | 0 | 0 | 0 | 0 | 0 | — | — | — |
| 15 → | 5 | 0 | 10 | 0 | 0 | 0 | — | — | — |
| 17 → | 5 | 0 | 10 | 0 | 0 | 0 | — | — | — |
| 19 → | 0 | 0 | 0 | 0 | 0 | 0 | — | — | — |
| PHOTO CODE → | — | — | C-70% | — | — | C-0% | — | — | — |
| MEASUREMENTS TAKEN BY | | M.Z.L., R.J. | | | COMPANY | | Myron Zucker, Inc. | | |

We claim:

1. Apparatus for locating and measuring harmonic distortion in a conductor, comprising:
   input means detachably connectable to a conductor for providing an input signal indicative of electrical energy in said conductor;
   filter means connected to said input means for filtering said input signal relative to a predetermined frequency to thereby remove noise in the input signal;
   modifying means connected to said input means and receiving said input signal therefrom, said modifying means providing a modified signal indicative of the strength of a single, predetermined harmonic of said input signal;

harmonic varying means connected to said modifying means for selectively varying the single, predetermined harmonic which is indicated by said modified signal;

said modified signal indicates one of voltage harmonics and current harmonics; and means interconnected between said filtering means and said modifying means for automatically controlling a gain of said input signal so that said apparatus does not have to be recalibrated prior to each use, and so that said input signal remains essentially constant despite variations of the electrical energy in said conductor.

2. Apparatus according to claim 1, wherein:

said input means comprises a voltage input box adapted to be selectively connected to said conductor and including a voltage divider network to provide a proper operating voltage, a current transformer adapted to be selectively clamped around said conductor, and a switch adapted to selectively be moved between a current input position and a voltage input position; and said filter means and said gain controlling means are adapted to function only in relation to current input signals input from said current transformer.

3. Apparatus according to claim 1, wherein:

said filter means is an active filter comprising a plurality of op-amps.

4. Apparatus according to claim 3, wherein said active filter is a 60 Hertz filter.

5. Apparatus according to claim 1, further comprising:

means for selectively monitoring a level of energy in said conductor.

6. Apparatus according to claim 5, wherein:

said monitoring means is connected to said input means, and is adapted to provide an output signal indicative of current level in said conductor while said modifying means is simultaneously providing said modified signal.

7. Apparatus according to claim 6, wherein said monitoring means includes a switch adapted to be selectively actuated by an operator to receive said input signal from said input means, an output jack adapted to have an amperage meter connected thereto, and a voltage divider connected between said switch and said output jack.

8. Apparatus according to claim 5, wherein:

said apparatus further comprises display means connected to said harmonic varying means and receiving said modified signal therefrom, said display means providing a display of said modified signal.

9. Apparatus according to claim 1, wherein said gain controlling means comprises a pre-calibrated compandor.

10. Apparatus according to claim 8, wherein:

said apparatus further comprises power supply means connected to each of said input means, said filtering means, said modifying means, said harmonic varying means, said display means and said gain control means for supplying power thereto.

11. Apparatus according to claim 5, wherein:

said modifying means comprises a band pass filter; and said modified signal indicates the strength of the single, predetermined harmonic relative to the strength of a fundamental frequency component of said input signal.

12. Apparatus according to claim 5, wherein:

said modifying means comprises a multiple-order programmable, switched capacitor, band pass filter; and said modified signal indicates the strength of the single, predetermined harmonic relative to the strength of a fundamental frequency component of said input signal.

13. Apparatus according to claim 5, wherein:

said harmonic varying means comprises a frequency synthesizer.

14. Apparatus according to claim 13, wherein:

said frequency synthesizer includes a harmonic selector switch adapted to be manually set by an operator to different harmonics, a source clock, and a phase lock loop connected between the source clock and the harmonic selector switch.

15. Apparatus according to claim 14, wherein:

said frequency synthesizer further comprises a programmable logic array connected between said selector switch and said phase lock loop.

16. Apparatus according to claim 8, wherein:

said display means comprises a multi-step light bar and a plurality of LEDs associated with the light bar.

17. Apparatus according to claim 10, wherein:

said power supply means comprises a rechargeable battery, a recharger circuit connected to the battery, said recharger circuit being selectively connectable to an external power source and an indicator circuit connected to the battery for indicating when said battery is running low on power.

18. Apparatus according to claim 17, wherein:

said indicator circuit comprises a first LED functioning as a voltage reference, and a second LED for indicating low battery power.

19. Apparatus according to claim 9, wherein said gain controlling means further comprises an op-amp.

* * * * *